United States Patent
Minzoni

(10) Patent No.: US 10,949,294 B2
(45) Date of Patent: Mar. 16, 2021

(54) METHOD OF CORRECTING AN ERROR IN A MEMORY ARRAY IN A DRAM DURING A READ OPERATION AND A DRAM

(71) Applicant: XI'AN UNIIC SEMICONDUCTORS CO., LTD., Xi'an Shaanxi (CN)

(72) Inventor: Alessandro Minzoni, Xi'an Shaanxi (CN)

(73) Assignee: Xi'an UNIIC Semiconductors Co., Ltd., Shaanxi (CN)

( * ) Notice: Subject to any disclaimer, the term of this patent is extended or adjusted under 35 U.S.C. 154(b) by 92 days.

(21) Appl. No.: 15/982,235

(22) Filed: May 17, 2018

(65) Prior Publication Data

US 2018/0336091 A1    Nov. 22, 2018

(30) Foreign Application Priority Data

May 17, 2017   (CN) .......................... 2017 1 0350971

(51) Int. Cl.
| | | |
|---|---|---|
| *G06F 11/00* | (2006.01) | |
| *G06F 11/10* | (2006.01) | |
| *G11C 11/4091* | (2006.01) | |
| *G11C 29/42* | (2006.01) | |
| *G11C 29/52* | (2006.01) | |
| *G11C 29/04* | (2006.01) | |

(52) U.S. Cl.
CPC ...... *G06F 11/1044* (2013.01); *G06F 11/1048* (2013.01); *G11C 11/4091* (2013.01); *G11C 29/42* (2013.01); *G11C 29/52* (2013.01); *G11C 2029/0411* (2013.01)

(58) Field of Classification Search
None
See application file for complete search history.

(56) References Cited

U.S. PATENT DOCUMENTS

| | | | | | |
|---|---|---|---|---|---|
| 5,357,517 | A | * | 10/1994 | Takebe | .................... H04L 43/00 340/3.43 |
| 6,978,343 | B1 | * | 12/2005 | Ichiriu | .................... G11C 15/00 365/49.1 |
| 7,246,199 | B2 | * | 7/2007 | Smith | .................... G06F 3/0613 710/3 |

(Continued)

OTHER PUBLICATIONS

Y.-. Park, S. Choi and H.-. Yoo, "Bit-wise read-compare-write scheme for low power read-modify-write DRAM operation," in Electronics Letters, vol. 38, No. 2, pp. 62-63, Jan. 17, 2002.doi: 10.1049/el:20020069 (Year: 2002).*

(Continued)

*Primary Examiner* — Daniel F. McMahon
(74) *Attorney, Agent, or Firm* — Leydig, Voit & Mayer, Ltd.

(57) ABSTRACT

A method of correcting an error in a memory array in a DRAM during a read operation, wherein the memory array includes a data array and an ECC array, the method comprising: reading data from the memory array; when the data contains one or more erroneous data bits, correcting the erroneous data bits by an ECC decoding and correcting module in the DRAM; registering only corrected erroneous data bits and their positions in a register; controlling a plurality of write drivers in the DRAM by the register so as to write only the corrected erroneous data bits back to the memory array.

21 Claims, 3 Drawing Sheets

(56) References Cited

U.S. PATENT DOCUMENTS

| | | | |
|---|---|---|---|
| 2002/0018389 A1* | 2/2002 | Ito | G06F 11/1008 |
| | | | 365/222 |
| 2005/0286330 A1* | 12/2005 | Ito | G11C 11/406 |
| | | | 365/222 |
| 2006/0182187 A1* | 8/2006 | Likovich, Jr. | H04L 1/22 |
| | | | 375/257 |
| 2014/0331101 A1* | 11/2014 | Chung | G06F 11/085 |
| | | | 714/755 |
| 2017/0031756 A1* | 2/2017 | Chung | G06F 11/1068 |

OTHER PUBLICATIONS

Authors et al., "Check bit Write Back with Driver Interlock", TDB n7b 12-91 p. 134-135, Dec. 1, 1991, IP.com No. IPCOM000122579D (Year: 1991).*

P. Chen et al., "An Enhanced EDAC Methodology for Low Power PSRAM," 2006 IEEE International Test Conference, Santa Clara, CA, 2006, pp. 1-10, doi: 10.1109/TEST.2006.297689. (Year: 2006).*

* cited by examiner

METHOD OF CORRECTING AN ERROR IN A MEMORY ARRAY IN A DRAM DURING A READ OPERATION AND A DRAM

CROSS-REFERENCE TO RELATED APPLICATIONS

This application claims priority under 35 USC 119(a) to Chinese Application No. 201710350971.2, filed May 17, 2017, which is hereby incorporated by reference in its entirety.

TECHNICAL FIELD

The present invention relates to the field of memory, and in particular to DRAM, and more particularly to a method of correcting an error in a memory array in a DRAM during a read operation and a DRAM.

BACKGROUND ART

DRAM (Dynamic Random Access Memory) is a volatile memory.

As for DRAM, data errors often occur during data storage, and thus there is a need for error detection and correction techniques to ensure correct data storage. ECC (Error Correction Code) detects and corrects the erroneous data by adding parity bits to a certain length of data bits. The conventional read and write processes of a DRAM including ECC function are shown in FIG. 1 and FIG. 2 respectively.

FIG. 1 schematically depicts a data write process of a DRAM, in which a data array is used to store data and an ECC array is used to store ECC bits, i.e. parity bits. When an N-bit data is written into a memory from an external source, the N-bit data is used by the memory to generate M-bit parity bits through an ECC encoding module. The N-bit data and the M-bit parity bits are temporarily latched, and then written into respective memory arrays by means of write drivers, i.e. the N-bit data is stored in the data array and the M-bit parity bits are stored in the ECC array. The length N of the data is greater than 0 and less than or equal to the length of the data that can be read or written by the memory when the memory performs one read or write operation. The length M of the parity bits is greater than 0 and its value is determined by the selected ECC algorithm. It should be noted that the data array, the ECC array and the ECC encoding module are all in the memory, and the memory may also include other components, which are not shown here.

FIG. 2 schematically depicts a data read process of the DRAM. The N-bit data and the M-bit parity bits are read from respective memory arrays, and then amplified by a sense amplifier. The amplified data and parity bits are temporarily latched, and then sent to the ECC decoding and correcting module. The ECC decoding and correcting module can detect and correct the error and output a corrected N-bit data.

FIG. 3 shows a data read process with error correction. FIG. 3 only shows that the error (or errors) exists in the data array. Nevertheless, it should be understood that the error may also exist in the ECC array. The data is read from the data array and then is amplified by the sense amplifier carried the same error information with the error in the data of the data array, which error information is corrected by the ECC decoding and correcting module, so that the data read into an system external to the memory is data with no error. Although the data read into the system external to the memory is correct, the corresponding data in the memory array is still erroneous. As time goes by, more errors will occur in the memory array. As shown in FIG. 4, if the number of the erroneous data is beyond the capability of the ECC detection and correction module, the ECC decoding and correcting module can neither detect an error, nor correct an error, and the data read into the system external to the memory will be erroneous.

Therefore, there is a need for being able to correct the error in the data array and the ECC array in a timely manner.

SUMMARY OF THE INVENTION

According to a first aspect of the present invention, there is provided a method of correcting an error in a memory array in a DRAM during a read operation, wherein the memory array includes a data array and an ECC array, the method comprising:

reading data from the memory array;

when the data contains one or more erroneous data bits, correcting the erroneous data bits by an ECC decoding and correcting module in the DRAM;

registering only corrected erroneous data bits and their positions in a register;

controlling a plurality of write drivers in the DRAM by the register so as to write only the corrected erroneous data bits back to the memory array.

According to a preferred embodiment of the method of the invention, the register includes a data register and a position register, and wherein the corrected erroneous data bits are registered in the data register, and the positions of the corrected erroneous data bits are registered in the position register.

According to a preferred embodiment of the method of the present invention, the data register comprises one or more sub-registers, the number of which is that of the bits of errors that can be corrected by the ECC decoding and correcting module, and wherein each of the one or more sub-registers is connected to everyone of the plurality of write drivers respectively, and enable signals are sent by the position register according to the positions of the corrected erroneous data bits, so as to activate corresponding write drivers.

According to a preferred embodiment of the method according to the invention, the erroneous data bits exist in the data array.

According to a preferred embodiment of the method according to the invention, the erroneous data bits exist in the ECC array.

According to a preferred embodiment of the method of the present invention, the write drivers are the write drivers that have already existed in the memory, wherein when a read operation is performed, enable signals are sent by the position register according to the positions of the corrected erroneous data bits, so as to activate corresponding write drivers and control the transfer of the corrected erroneous data bits in the data register to the write drivers; when a write operation is performed, the connections between the data register and the write drivers are disconnected, so that the data to be written is externally determined.

According to a preferred embodiment of the method of the present invention, the write drivers are new write drivers that are different from the write drivers that have already existed in the memory, wherein when a write operation is performed, the already existed write drivers drive the external data to be written into the data array, and the new write drivers are deactivated; when a read operation is performed, the already existed write drivers are deactivated, and if the corrected erroneous data bits exist, enable signals are sent by the position register according to the positions of the corrected erroneous data bits, so as to activate corresponding write drivers and control the transfer of the corrected erroneous data bits in the data register to the write drivers.

According to a second aspect of the present invention, there is provided a DRAM. The DRAM comprises a memory array, the memory array comprising a data array and an ECC array, wherein the DRAM further comprises a register, wherein the register registers only one or more erroneous data bits corrected by an ECC decoding and correcting module in the DRAM and their positions.

According to a preferred embodiment of the DRAM of the present invention, the register includes a data register and a position register, and wherein the corrected erroneous data bits are registered in the data register and the positions of the corrected erroneous data bits are registered in the position register.

According to a preferred embodiment of the DRAM of the present invention, the DRAM has a plurality of write drivers and the data register comprises one or more sub-registers, wherein the number of the one or more sub-registers is that of the bits of errors that can be corrected by the ECC decoding and correcting module, and wherein each of the one or more sub-registers is connected to everyone of the plurality of write drives respectively, and enable signals are sent by the position registers according to the positions of the corrected erroneous data bits, so as to activate corresponding write drivers.

According to a preferred embodiment of the DRAM of the present invention, the write drivers are the write drivers that have already existed in the memory, wherein when a read operation is performed, enable signals are sent by the position register according to the positions of the corrected erroneous data bits, so as to activate corresponding write drivers and control the transfer of the corrected erroneous data bits in the data register to the write drivers; when a write operation is performed, the connections between the data register and the write drivers are disconnected, so that the data to be written is externally determined.

According to a preferred embodiment of the DRAM of the present invention, the write drivers are new write drivers that are different from write drivers that have already existed in the memory, wherein when a write operation is performed, the already existed write drivers drive the external data to be written into the data array, and the new write drivers are deactivated; when a read operation is performed, the already existed write drivers are deactivated, and if the corrected erroneous data bits exist, enable signals are sent by the position register according to the positions of the corrected erroneous data bits, so as to activate corresponding write drivers and control the transfer of the corrected erroneous data bits in the data register to the write drivers.

The present invention has at least the following advantages:

The method of the present invention can correct error by changing the value of the memory array and thus correct the error at source. Since the error correction range of ECC is related to the selected algorithm, the ECC error correction will be impossible once the number of errors is beyond the error correction range. The correction of errors at source can improve the performance of the ECC error correction.

Little change to the existing circuitries is needed, because only the register for registering the corrected erroneous data bits and their positions and its control on the write drives are added, and all other circuitries use the existing circuitries in a conventional memory.

Since the correction of the memory array occurs during the read operation, it requires no extra command control and no extra timing control, and is compatible with the specifications of the memory and thus does not affect the performance of the memory.

Control is flexible, because there is less requirement on the storage capacity of the register, and thus less increase of the power consumption and the area given the fact that only the corrected erroneous data bits and their positions rather than the entire data with corrected error are written into the register.

DETAILED DESCRIPTION OF THE INVENTION

Various examples of the present invention will be further described below with reference to the accompanying drawings. It should be understood that the embodiments described below with reference to the accompanying drawings are only exemplary, being intended to explain rather than limit the present invention.

According to one embodiment of the invention, a register for only registering the corrected erroneous data bits and their positions is introduced. A read command is given to the DRAM by an external system to indicate data of which address is to be read, and then the data is read out. Once the ECC detects that the data that is read out is erroneous, the erroneous data will be corrected by the ECC, and the corrected data will be sent to the external system. At the same time, only the corrected erroneous data bits and their positions are registered in this extra register, which uses the write drivers already existing in the DRAM to write the corrected erroneous data bits into the corresponding positions in the memory array, whereby correcting the erroneous data in the data array and the ECC array, and thus correcting the error at source. It should be noted that the term "read operation" herein refers to an operation that lasts from the external system giving the DRAM a read command to read data to the data being sent to the external system, and registering only the corrected erroneous data bits and their positions in the register and writing only the corrected erroneous data bits into the corresponding positions in the memory array by the register also occur during the read operation process.

Figure 5:
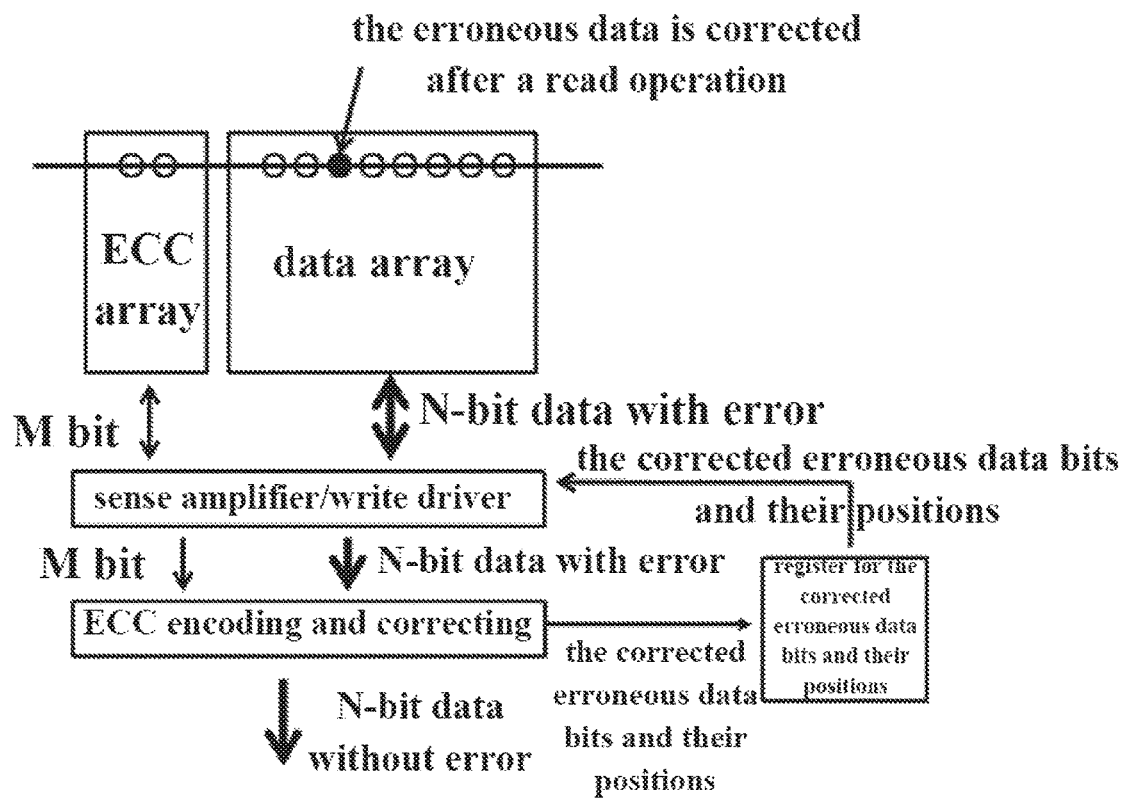
FIG. 5 shows a data read process with error correction in a memory with a register for only registering the corrected erroneous data bits and their positions according to one embodiment of the present invention.

FIG. 5 shows a data read process with error correction in a memory with a register for registering only the corrected erroneous data bits and their positions according to one embodiment of the present invention.

Figure 1:
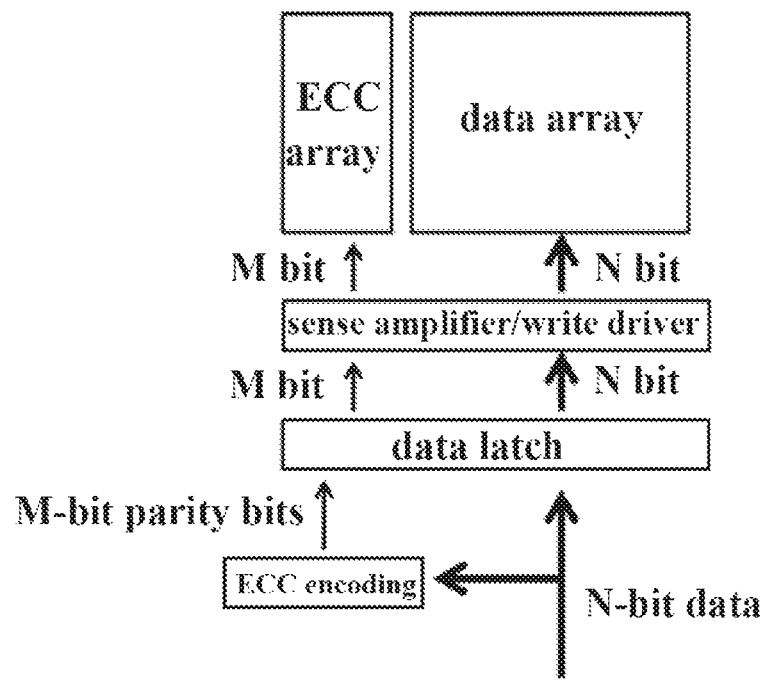
FIG. 1 schematically depicts a data write process of the DRAM.
Figure 2:
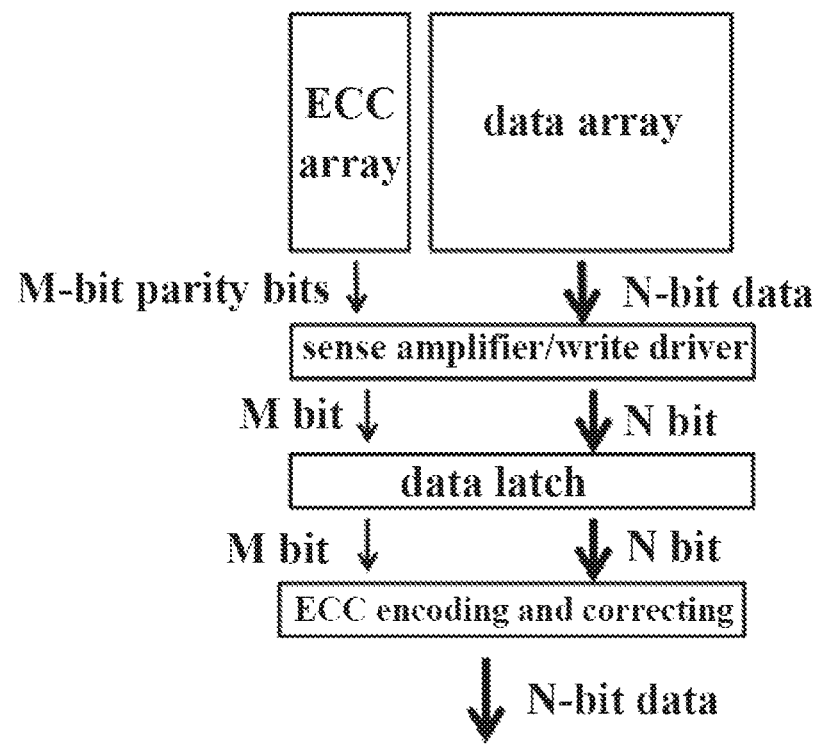
FIG. 2 schematically depicts a data read process of the DRAM.
Figure 3:
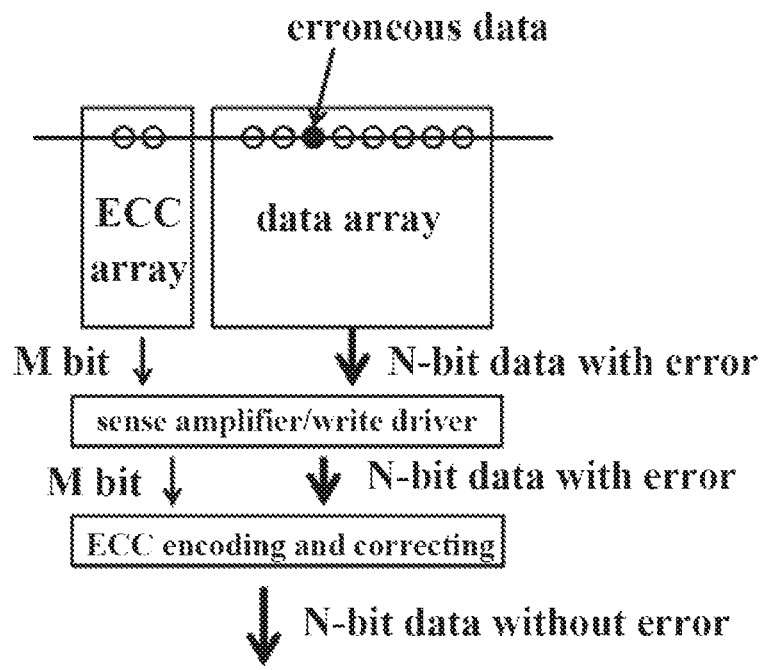
FIG. 3 shows a data read process with error correction.
Figure 4:
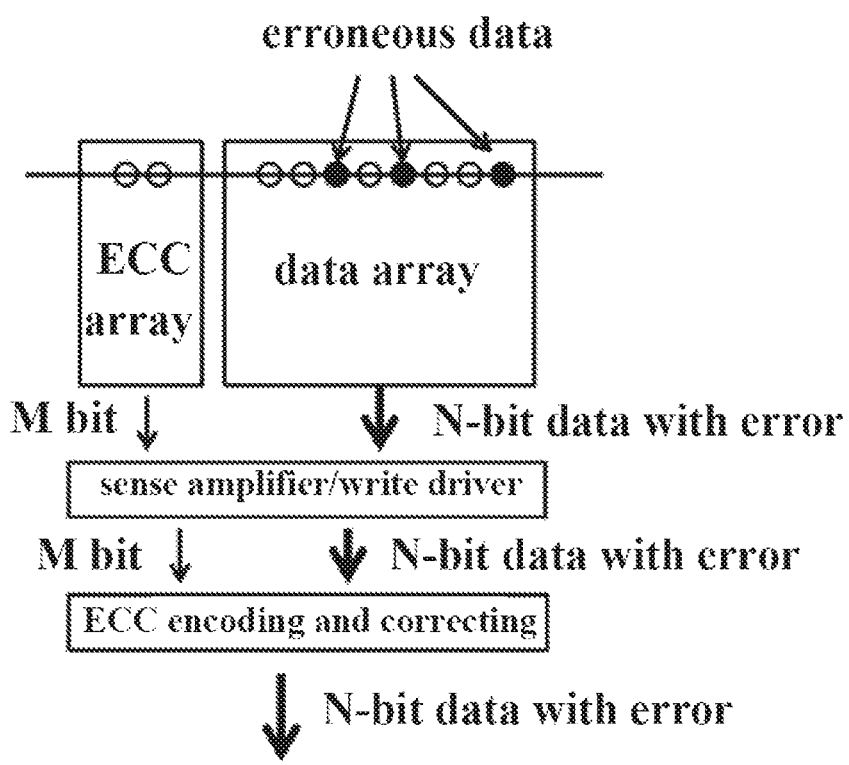
FIG. 4 shows a data read process with error correction beyond the error correction range of ECC.

As shown in FIG. 5, when the read process as shown in FIG. 3 occurs, after being decoded and corrected by ECC, the corrected data is read into the system external to the memory. At the same time, only the corrected erroneous data bits and their positions are registered in a register, i.e. registered in the register shown in FIG. 5 for registering only the corrected erroneous data bits and their positions. Then, the corrected erroneous data bits and their positions control the write drivers, wherein the positions of the corrected erroneous data bits activate the write drivers corresponding thereto to write the corrected erroneous data bits into the data array, thereby rewriting the erroneous data in the data array to correct values. The control of the write drivers is performed after the ECC decoding and correcting module corrects the data and is stable.

It should be understood that although FIG. 5 only shows the error in the data array, this method is not limited to such a case, and can also be used for correcting the error in the ECC array. Similarly, the erroneous data in the ECC array can also be rewritten by the register in which the corrected data and its position are registered, the method of which is similar to the above-mentioned operation as to the array and will not be described here.

Figure 6:
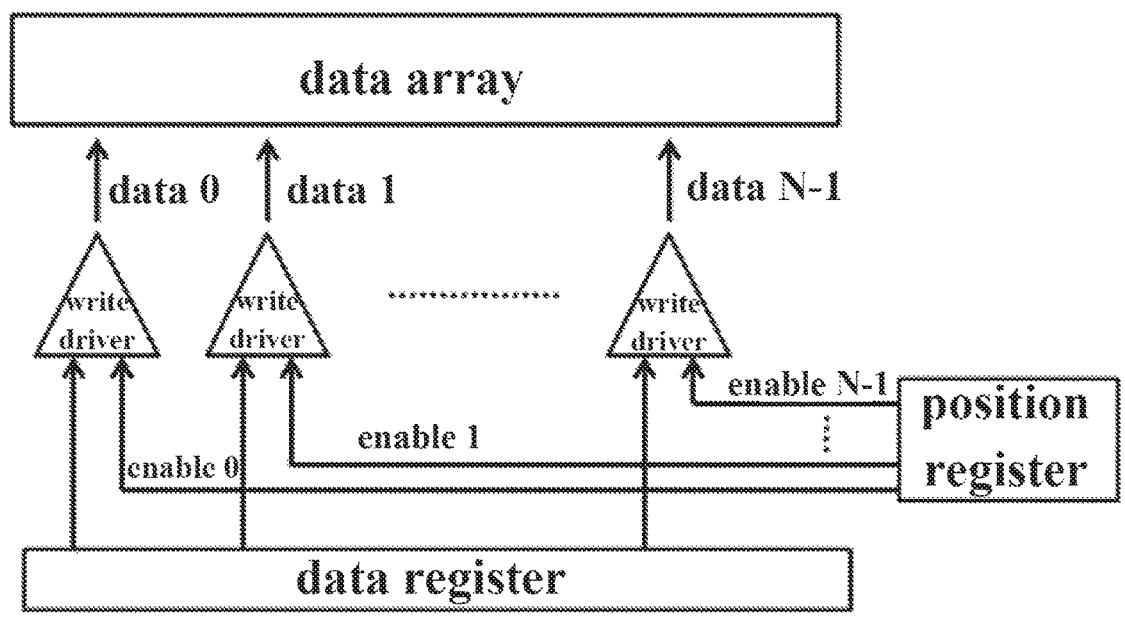
FIG. 6 shows a schematic illustration of how the register for registering only the corrected erroneous data bits and their positions controls the write drivers according to one embodiment of the present invention.

FIG. 6 shows a schematic illustration of how the register for registering only the corrected erroneous data bits and their positions controls the write drivers according to one embodiment of the present invention.

As shown in FIG. 6, after the data that is read out is decoded and corrected by ECC, the corrected erroneous data bits are registered in a data register, and the positions of the corrected erroneous data bits are registered in a position register. The data register and the position register are part of the register for registering only the corrected erroneous data bits and their positions, respectively.

In one preferred embodiment, this data register may be connected in a manner of one-to-one correspondence with a plurality of write drivers in the DRAM (for example, the data register may include N individual sub-registers, and each write driver corresponds to an individual sub-register; N is the length of data that is read out from the memory array during one read operation, i.e. the number of bits of the data that is read out; each data shown in FIG. 6 represents a 1-bit data, and a 1-bit data, if any, is registered in each of the N individual sub-registers). In such case, the corrected erroneous data bits are registered in the corresponding sub-registers of the N sub-registers, while the positions of the erroneous data bits in the N-bit data are registered in the position register. It should be understood that in this embodiment, the position register may not be provided or activated. With respect to this, besides the corrected erroneous data bits, the corrected data bits in the N-bit data that is read out are also registered in the data register, i.e. each of the N sub-registers registers a 1-bit data. In such case, the error in the memory array can be corrected as long as all the data in the data register are written back into the data array of the DRAM.

In another preferred embodiment, the number of individual sub-registers contained in the data register can also be set according to the number of the erroneous bits in the data that the ECC decoding and correcting module can correct; for example, when the ECC can only correct 1-bit data error, the data register in FIG. 6 may use only one individual sub-register, which is connected together with all the write drivers, and the position register selects only one corresponding write driver to be activated. The position register registers the positions of the erroneous data bits in the N-bit data that is read out during the read operation. The positions activate the write drivers corresponding to the erroneous data bits. The data register registers the corrected erroneous data bits.

For example, if data 0 is detected erroneous during the read process, the corrected data 0 is registered in the data register, and the position information of data 0 is also registered in the position register and is used to generate an enable signal which activates the write driver corresponding to data 0, and the corrected data 0 is written into the data array and thereby the erroneous value in the data array is rewritten to be a correct value.

This present invention makes little change to the existing circuitries, because only the register for registering the corrected erroneous data bits and their positions and its control on the write drivers need to be added, and all the other circuitries utilize the existing circuitries of a conventional memory. In addition, since the correction of the memory array occurs during the read operation, it requires no extra command control and no extra timing control, and is compatible with the specifications of the memory and thus does not affect the performance of the memory. In addition, since only the corrected erroneous data bits and their positions rather than the entire erroneous data are written into the register, less storage capacity of the register is required, resulting in less increase of the power consumption and the area.

It should be understood that the existing write drivers of the memory can be used as the write drivers shown in FIG. 6 because it is not necessary to use the existing write drivers in the conventional read operation. When a read operation is performed, an enable signal in FIG. 6 (an enable signal generated by the position register according to the position of an corrected erroneous data bit), on the one hand, activates a corresponding write driver so that the write driver can write the corrected erroneous data bit into the memory array, and on the other hand needs to be able to control the transfer of the corrected erroneous data bit in the data register to the write driver. When a normal write operation is performed, the connections between the data register and the write drivers in FIG. 6 are disconnected so that the data to be written is externally determined.

In addition, new write drivers may also be introduced to constitute the write drivers shown in FIG. 6. The newly introduced write drivers and the write drivers that have already existed in the memory exist together. When a normal write operation is performed, the already existed write drivers drive the external data to be written into the data array, and the newly introduced write drivers are deactivated; when a normal read operation is performed, the already existed write drivers are deactivated, and if there are corrected erroneous data bits, the corresponding write drivers are activated by the position information of the corrected erroneous data bits to write the corrected erroneous data bits back into the corresponding data array.

It should be noted that the above-mentioned embodiments illustrate rather than limit the invention, and that those skilled in the art will be able to design many alternative embodiments. Use of the verb "comprise" and its conjugations does not exclude the presence of elements or steps other than those stated in a claim. The article "a" or "an" preceding an element does not exclude the presence of a plurality of such elements.

The invention claimed is:

1. A method of correcting an error in a memory array in a DRAM during a read operation, wherein the memory array includes a data array and an ECC array, the method comprising:
reading data from the memory array;
when the data contains one or more correctable erroneous data bits, correcting the one or more correctable erroneous data bits by an ECC decoding and correcting module in the DRAM;
storing only corrected one or more erroneous data bits and positions of the corrected one or more erroneous data bits in a register; and
controlling a plurality of write drivers in the DRAM by the register so as to write only the corrected one or more erroneous data bits back to the memory array.

2. The method according to claim 1, wherein the register includes a data register and a position register, and wherein the corrected one or more erroneous data bits are stored in the data register, and the positions of the corrected one or more erroneous data bits are stored in the position register.

3. The method according to claim 2, wherein the data register comprises one or more sub-registers, number of the one or more sub-registers is that of bits of errors that can be corrected by the ECC decoding and correcting module, and wherein each of the one or more sub-registers is connected in a manner of one-to-one correspondence with the plurality of write drivers, and enable signals are sent by the position register according to the positions of the corrected one or more erroneous data bits, so as to activate corresponding write drivers.

4. The method according to claim 1, wherein the one or more correctable erroneous data bits exist in the data array, or in the ECC array, or in the data array and the ECC array.

5. The method according to claim 2, wherein the one or more correctable erroneous data bits exist in the data array, or in the ECC array, or in the data array and the ECC array.

6. The method according to claim 3, wherein the one or more correctable erroneous data bits exist in the data array, or in the ECC array, or in the data array and the ECC array.

7. The method according to claim 1, wherein the plurality of write drivers are the external data write drivers that have already existed in the memory, wherein when a read operation is performed, enable signals are sent by the register according to the positions of the corrected one or more erroneous data bits, so as to activate corresponding write drivers and control the transfer of the corrected one or more erroneous data bits in the data register to the corresponding write drivers; when a write operation is performed, the connections between the data register and the plurality of write drivers are disconnected, so that the data to be written is externally determined.

8. The method according to claim 2, wherein the plurality of write drivers are external data write drivers that have already existed in the memory, wherein when a read operation is performed, enable signals are sent by the position register according to the positions of the corrected one or more erroneous data bits, so as to activate corresponding write drivers and control the transfer of the corrected one or more erroneous data bits in the data register to the corresponding write drivers; when a write operation is performed, the connections between the data register and the plurality of write drivers are disconnected, so that the data to be written is externally determined.

9. The method according to claim 3, wherein the plurality of write drivers are external data write drivers that have already existed in the memory, wherein when a read operation is performed, enable signals are sent by the position register according to the positions of the corrected one or more erroneous data bits, so as to activate the corresponding write drivers and control the transfer of the corrected one or more erroneous data bits in the data register to the corresponding write drivers; when a write operation is performed, the connections between the data register and the plurality of write drivers are disconnected, so that the data to be written is externally determined.

10. The method according to claim 1, wherein the plurality of write drivers are new write drivers that are different from external data write drivers that have already existed in the memory, wherein when a write operation is performed, the external data write drivers drive external data to be written into the data array, and the new write drivers are deactivated; when a read operation is performed, the external data write drivers are deactivated, and if the corrected one or more erroneous data bits exist, enable signals are sent by the register according to the positions of the one or more corrected erroneous data bits, so as to activate corresponding write drivers and control the transfer of the corrected one or more erroneous data bits in the data register to the corresponding write drivers.

11. The method according to claim 2, wherein the plurality of write drivers are new write drivers that are different from external data write drivers that have already existed in the memory, wherein when a write operation is performed, the external data write drivers drive external data to be written into the data array, and the new write drivers are deactivated; when a read operation is performed, the external data write drivers are deactivated, and if the corrected one or more erroneous data bits exist, enable signals are sent by the position register according to the positions of the corrected one or more erroneous data bits, so as to activate corresponding write drivers and control the transfer of the corrected one or more erroneous data bits in the data register to the corresponding write drivers.

12. The method according to claim 3, wherein the plurality of write drivers are new write drivers that are different from external data write drivers that have already existed in the memory, wherein when a write operation is performed, the external data write drivers drive external data to be written into the data array, and the new write drivers are deactivated; when a read operation is performed, the external data write drivers are deactivated, and if the corrected one or more erroneous data bits exist, enable signals are sent by the position register according to the positions of the corrected one or more erroneous data bits, so as to activate the corresponding write drivers and control the transfer of the corrected one or more erroneous data bits in the data register to the corresponding write drivers.

13. A DRAM comprising a memory array, the memory array comprising a data array and an ECC array, wherein the DRAM further comprises a register; an ECC decoding and correcting module; and a plurality of write drivers;
wherein the register stores only corrected one or more erroneous data bits that are corrected by the ECC decoding and correcting module and positions of the corrected one or more erroneous data bits, and wherein the register is configured to control the plurality of write drivers to write only the corrected one or more erroneous data bits back to the memory array when a read operation is performed.

14. The DRAM according to claim 13, wherein the register includes a data register and a position register, and wherein the corrected one or more erroneous data bits are stored in the data register and the positions of the corrected one or more erroneous data bits are stored in the position register.

15. The DRAM according to claim 14, wherein the data register comprises one or more sub-registers, wherein number of the one or more sub-registers is that of bits of errors that can be corrected by the ECC decoding and correcting module, and wherein each of the one or more sub-registers is connected in a manner of one-to-one correspondence with the plurality of write drives, and enable signals are sent by the position registers according to the positions of the corrected one or more erroneous data bits, so as to activate corresponding write drivers.

16. The DRAM according to claim 13, wherein the plurality of write drivers are external data write drivers that have already existed in the memory, wherein when a read operation is performed, enable signals are sent by the position register according to the positions of the corrected one or more erroneous data bits, so as to activate corresponding write drivers and control the transfer of the corrected one or more erroneous data bits in the data register to the corresponding write drivers; when a write operation is performed, the connections between the data register and the plurality of write drivers are disconnected, so that the data to be written is externally determined.

17. The DRAM according to claim 14, wherein the plurality of write drivers are external data write drivers that have already existed in the memory, wherein when a read operation is performed, enable signals are sent by the position register according to the positions of the corrected one or more erroneous data bits, so as to activate corresponding write drivers and control the transfer of the corrected one or more erroneous data bits in the data register to the corresponding write drivers; when a write operation is performed, the connections between the data register and the plurality of write drivers are disconnected, so that the data to be written is externally determined.

18. The DRAM according to claim 15, wherein the plurality of write drivers are external data write drivers that have already existed in the memory, wherein when a read operation is performed, enable signals are sent by the position register according to the positions of the corrected one or more erroneous data bits, so as to activate the corresponding write drivers and control the transfer of the corrected one or more erroneous data bits in the data register to the corresponding write drivers; when a write operation is performed, the connections between the data register and the plurality of write drivers are disconnected, so that the data to be written is externally determined.

19. The DRAM according to claim 13, wherein the plurality of write drivers are new write drivers that are different from external data write drivers that have already existed in the memory, wherein when a write operation is performed, the external data write drivers drive external data to be written into the data array, and the new write drivers are deactivated; when a read operation is performed, the external data write drivers are deactivated, and if the corrected one or more erroneous data bits exist, enable signals are sent by the position register according to the positions of the corrected one or more erroneous data bits, so as to activate corresponding write drivers and control the transfer of the corrected one or more erroneous data bits in the data register to the corresponding write drivers.

20. The DRAM according to claim 14, wherein the plurality of write drivers are new write drivers that are different from external data write drivers that have already existed in the memory, wherein when a write operation is performed, the external data write drivers drive external data to be written into the data array, and the new write drivers are deactivated; when a read operation is performed, the external data write drivers are deactivated, and if the corrected one or more erroneous data bits exist, enable signals are sent by the position register according to the positions of the corrected one or more erroneous data bits, so as to activate corresponding write drivers and control the transfer of the corrected one or more erroneous data bits in the data register to the corresponding write drivers.

21. The DRAM according to claim 15, wherein the plurality of write drivers are new write drivers that are different from external data write drivers that have already existed in the memory, wherein when a write operation is performed, the external data write drivers drive external data to be written into the data array, and the new write drivers are deactivated; when a read operation is performed, the external data write drivers are deactivated, and if the corrected one or more erroneous data bits exist, enable signals are sent by the position register according to the positions of the corrected one or more erroneous data bits, so as to activate the corresponding write drivers and control the transfer of the corrected one or more erroneous data bits in the data register to the corresponding write drivers.

* * * * *